(12) United States Patent
Lui et al.

(10) Patent No.: US 7,960,233 B2
(45) Date of Patent: Jun. 14, 2011

(54) MOSFET WITH A SECOND POLY AND AN INTER-POLY DIELECTRIC LAYER OVER GATE FOR SYNCHRONOUS RECTIFICATION

(75) Inventors: Sik K. Lui, Sunnyvale, CA (US); Anup Bhalla, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/806,746

(22) Filed: Aug. 21, 2010

(65) Prior Publication Data
US 2010/0330767 A1 Dec. 30, 2010

Related U.S. Application Data

(62) Division of application No. 11/182,918, filed on Jul. 14, 2005, now Pat. No. 7,786,531.

(51) Int. Cl.
*H01L 21/336* (2006.01)
(52) U.S. Cl. ........ 438/270; 438/268; 257/301; 257/329; 257/331; 257/E27.016; 257/E27.06

(58) Field of Classification Search .................. 438/270, 438/268; 257/301, 329, 331, E27.016, E27.06
See application file for complete search history.

(56) References Cited

U.S. PATENT DOCUMENTS

2002/0137291 A1* 9/2002 Zandt In't et al. ............ 438/270
* cited by examiner

*Primary Examiner* — Kiesha R Bryant
*Assistant Examiner* — Tucker Wright
(74) *Attorney, Agent, or Firm* — Bo-In Lin

(57) ABSTRACT

This invention discloses a new trenched vertical semiconductor power device that includes a capacitor formed between a conductive layer covering over an inter-dielectric layer disposed on top of a trenched gate. In a specific embodiment, the trenched vertical semiconductor power device may be a trenched metal oxide semiconductor field effect transistor (MOSFET) power device. The trenched gate is a trenched polysilicon gate and the conductive layer is a second polysilicon layer covering an inter-poly dielectric layer disposed on top of the trenched polysilicon gate. The conductive layer is further connected to a source of the vertical power device.

13 Claims, 12 Drawing Sheets

MOSFET WITH A SECOND POLY AND AN INTER-POLY DIELECTRIC LAYER OVER GATE FOR SYNCHRONOUS RECTIFICATION

This is a Divisional Application of a previously filed application with Ser. No. 11/182,918 filed on Jul. 14, 2005 now U.S. Pat. No. 7,786,531 by identical common inventors of this Application. Application Ser. No. 11/182,918 is hereby incorporated by reference in this patent application.

BACKGROUND OF THE INVENTION

1. Field of the Invention

The invention disclosed herein relates generally to the device configuration of power MOSFETs. More particularly, this invention relates to a novel and improved device structure for preventing shoot through problem by using a capacitor formed on top of the gate as a second poly with an inter-poly dielectric layer.

2. Description of the Prior Art

Conventional power MOSFET devices still face the shoot through problems that result in excessive dissipation and efficiency loss. Referring to FIG. 1 for a circuit diagram of a conventional buck converter 10 that includes a high side MOSFET 15 and a low side MOSFET 20 serially connected between an input terminal 25 having an input voltage represented by Vin and a ground terminal 30. The drain of the low side MOSFET 20 is connected to the source of the high side MOSFET 15 at a mid point 35 connecting to the load 40 through inductance L and capacitance C. When the buck converter 10 operates at high speed, a shoot through condition becomes a problem when both the high side and low side MOSFET are turned on at the same time causing a shoot through current to flow between the input terminal 25 and the ground terminal 30. The shoot through condition results in excessive dissipation and efficiency loss. In order to avoid the shoot through problem, a controlling circuit 45 is implemented to control the gate signals to generate a dead time between the gate signals for the high side and low side MOSFET. FIG. 2 shows such a dead time between the time when the high side MOSFET 15 is turned off and the time when the low side MOSFET 20 is turned on such that the high side and low side MOSFETs are prevented from turning on simultaneously.

However, the shoot through problem cannot be completely avoided due to the fact that a large drain current is generated at the low side MOSFET 20 when the high side MOSFET 15 is turned on as shown in FIG. 3 due to a large rate of change of the voltage, i.e., dV/dt, at the mid-connection point 35. FIG. 4 shows an equivalent circuit of the buck converter wherein the drain current generated flows through the gate-drain capacitor Cgd and then to the ground through the internal gate-source capacitor Cgs or through an equivalent circuit segment comprises gate resistor Rg inductor Lg, and external gate drive resistance Rext. Under such circumstances, if the impedance from the gate to the ground is not below a certain value then the drain current, i.e., Cdg*dV/dt, will generate a voltage drop across the gate of the low side MOSFET that would be large enough to turn on the low side MOSFET 20 thus inducing shoot-through. The peak of the spike voltage can be expressed as:

$$Vspike = Vin * Crss/(Crss + Ciss)$$

Where the input capacitance Ciss and feedback capacitance Crss are determined by the following equations:

$$Ciss = Cgd + Cgs$$

$$Crss = Cgd$$

In modern circuit designs, a designer typically controls the problem by using a large gate-source capacitance Cgs or a low Crss/Ciss ratio. Increasing Cgs results in Crss/Ciss reduction. As it is shown in FIG. 4, a large Cgs has the benefit of drawing most of the transient drain current Cdg*dV/dt to the ground through the capacitor, leaving less current to go through the external gate controller thus lowering the gate spike voltage and avoiding shoot through. Alternately, the problem may also be prevented by providing a low gate resistance and using a high current gate drive with low Rext. However, if the gate drive circuitry, i.e., the control circuit 45, is remote from the MOSFET, the inductance Lg may become quite large. This causes the current path connected with Rg, Rext, and Lg to have great impedance thus leaving only the Cgs path to sink the transient current. The only way to suppress the shoot through current is by increasing the capacitance Cgs to reduce the impedance. However, this solution will lead to excessive gate charge losses in the low side MOSFET 20. For the above reasons, a person of ordinary skill of the art is faced with limitations and difficulties in designing a converter to effectively prevent the shoot through problem.

FIG. 5A shows a typical conventional trench MOSFET. As illustrated in this trench MOSFET cell, input capacitance Ciss includes the source to gate capacitance Cgs and the body to gate capacitance and Crss is the gate to drain capacitance. The ratio Crss/Ciss can be reduced either by increasing Ciss or reduce Crss. As shown in FIG. 5B, Crss is determined by the vertical area capacitance of the trench beyond the body region shown as C1, and C2 and further determined by another horizontal area capacitance shown as C3. Reducing the area capacitance C1, C2, or C3 can reduce the capacitance Crss. However, due to the process control, yield requirements and minimum linewidth limitations in the fabrication the trenched MOSFET, it is difficult to reduce the capacitances C1, C2, or C3. FIG. 6 shows a MOSFET with increased source depth to increase Ciss. This technique is difficult to implement for several reasons. First of all, the source junction depth may have to be significantly increased in order to increase the Ciss for reducing the Crss/Ciss ratio. However, in order to maintain the same channel length, the body junction depth must also be increased. The configuration as shown in FIG. 6 is not practical useful due to the limitations that it is difficult to manufacture a reliable trenched MOSFET device with short channel when implemented with a deep source and deep body junction.

Therefore, a need still exists in the art to provide an improved device configuration and manufacturing methods to make MOSFET devices with a reduced Crss/Ciss ratio to prevent the occurrences of shoot-through and resolve the above discussed difficulties as now encountered in the prior art.

SUMMARY OF THE PRESENT INVENTION

It is therefore an object of the present invention to provide an improved MOSFET device by reducing Crss/Ciss ratio with an increase of the gate-source capacitance Cgs to prevent the occurrences of shoot-through. The shoot through problem is resolved because an increase current is drawn to the ground thus preventing a spike voltage to turn on the gate. The technical difficulties and limitations are therefore resolved.

Specifically, it is an object of the present invention to provide an improved MOSFET device with a reduced Crss/Ciss by providing a capacitor over the trenched gate thus increasing the gate-source capacitance. The capacitor over the gate is formed with a new device configuration that has a second poly covers an inter-poly dielectric layer deposited over the trenched gate. The MOSFET further has a novel trenched gate wherein the trenched gate has a protrusion that protrudes out of the trench further reduces the Crss/Ciss. The increased Cgs and the reduced Crss/Ciss thus achieving the purpose of suppressing the shoot through and resolve the difficulties discussed above. Unlike the conventional techniques as shown in FIGS. 5 and 6, the reduction of the Crss/Ciss is achieved without requiring complicate fabrication processes and control of the recess electrode.

Briefly in a preferred embodiment this invention discloses a new trenched vertical semiconductor power device that includes a capacitor formed between a conductive layer covering over an inter-dielectric layer disposed on top of a trenched gate. In a preferred embodiment, the trenched vertical semiconductor further includes a trenched metal oxide semiconductor field effect transistor (MOSFET) power device. In a preferred embodiment, the trenched gate further includes a trenched polysilicon gate. In a preferred embodiment, the conductive layer further includes a second polysilicon layer covering an inter-poly dielectric layer disposed on top of a trenched polysilicon gate. In a preferred embodiment, the conductive layer is further connected to a source of the vertical power device. In a preferred embodiment, the trenched vertical semiconductor further includes a protective passivation layer covering the vertical semiconductor power device having metal contact openings to form metal contacts therein to electrically contact the trenched vertical semiconductor device. In a preferred embodiment, the inter-dielectric layer disposed above the trenched gate having a layer thickness ranging substantially the same as a gate dielectric thickness. In a preferred embodiment, the trenched gate further includes a gate protrusion protruding outside of the trenched gate. In a preferred embodiment, the trenched vertical semiconductor further includes a trenched N-channel metal oxide semiconductor field effect transistor (MOSFET) power device. In a preferred embodiment, the trenched vertical semiconductor further includes a trenched P-channel metal oxide semiconductor field effect transistor (MOSFET) power device.

This invention further discloses a method for fabricating a trenched vertical semiconductor power device by forming a capacitor between a conductive layer covering over an inter-dielectric layer disposed on top of a trenched gate. In a preferred embodiment, the method further includes a step of forming the trenched gate as a trenched polysilicon gate. In a preferred embodiment, the step of covering the conductive layer over the inter-dielectric layer further includes a step of forming a second polysilicon layer covering an inter-poly dielectric layer disposed on top of a trenched polysilicon gate. In another preferred embodiment, the method further includes a step of electrically connecting the conductive layer to a source of the vertical semiconductor power device. In another preferred embodiment, the method further includes a step of forming a protective passivation layer covering the vertical semiconductor power device and selectively etching metal contact openings to form metal contacts therein to electrically contact the trenched vertical semiconductor device. In another preferred embodiment, the step of forming the inter-dielectric layer disposed above the trenched gate further comprising a step of forming the inter-dielectric layer with a layer thickness substantially the same as a gate dielectric thickness. In another preferred embodiment, the method further includes a step of forming the trenched gate with a gate protrusion protruding outside of the trenched gate. In another preferred embodiment, the method further includes a step of forming the vertical semiconductor device as a trenched N-channel metal oxide semiconductor field effect transistor (MOSFET) power device. In another preferred embodiment, the method further includes a step of forming the vertical semiconductor device as a trenched P-channel metal oxide semiconductor field effect transistor (MOSFET) power device.

This invention further discloses a method for adjusting a gate-source capacitance (Cgs) of a trenched MOSFET device. The method includes a step of disposing a capacitor on top of a trenched gate by forming a conductive layer covering over an inter-dielectric layer deposited on top of the trenched gate of the MOSFET device. In another preferred embodiment, the method further includes a step of forming the trenched gate as a trenched polysilicon gate. In another preferred embodiment, the step of covering the conductive layer over the inter-dielectric layer further includes a step of forming a second polysilicon layer covering an inter-poly dielectric layer disposed on top of the trenched polysilicon gate. In another preferred embodiment, the method further includes a step of forming the trenched gate with a gate protrusion protruding outside of the trenched gate.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 7:
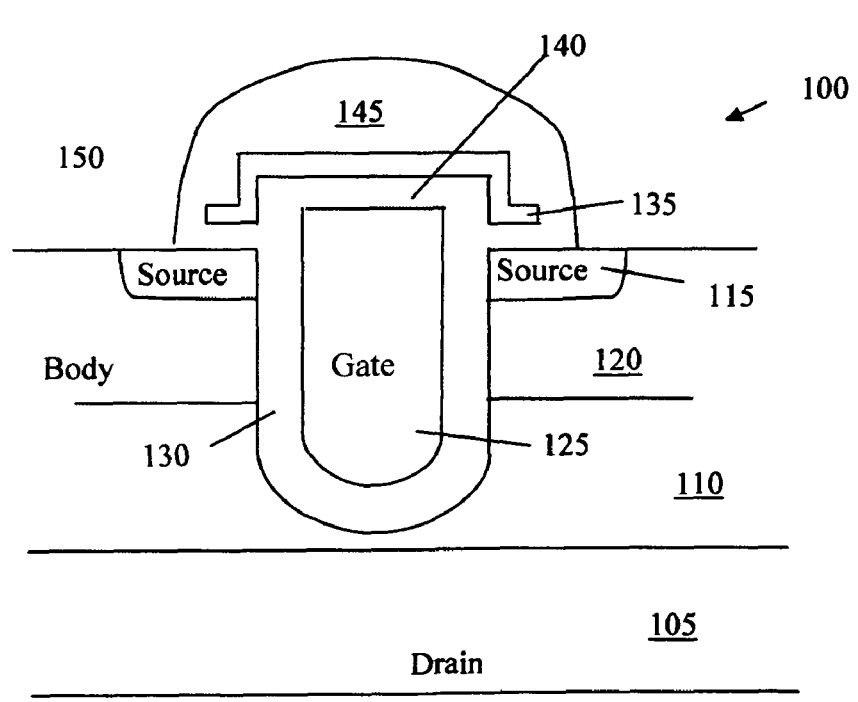
FIG. 7 is a side cross sectional view of a MOSFET device of this invention.

Referring to FIG. 7 for a side cross sectional view of a new MOSFET cell 100 of this invention. The MOSFET 100 is formed on an N+ substrate 105 functioning as a drain. The N+ substrate supporting a N− epi-layer 110 thereon to form a vertical pn-junction region with an N+ source region 115 formed on top of a deeper p-body region 120. The MOSFET 100 further includes a gate 125 formed with polysilicon layer deposited in a trench formed in the epi-layer 110 with a gate oxide layer 130 insulating the gate 125 inside the trench. A current path is established from the source 115 via a channel formed in the p-body 120 along the gate 125 and extends to the drain in the N+ substrate 105 when gate 125 is properly biased. In this new MOSFET cell 100, an additional polysilicon layer 135 electrically connected to the source 115 is formed on top of an inter-poly dielectric layer 140 overlying the polysilicon in the trenched gate 125. An insulation layer 145 formed with BPSG covering the MOSFET cell with metal contact opening for contact metal layer 150 electrically connected to the source 115 and body regions 120.

Figure 8A:
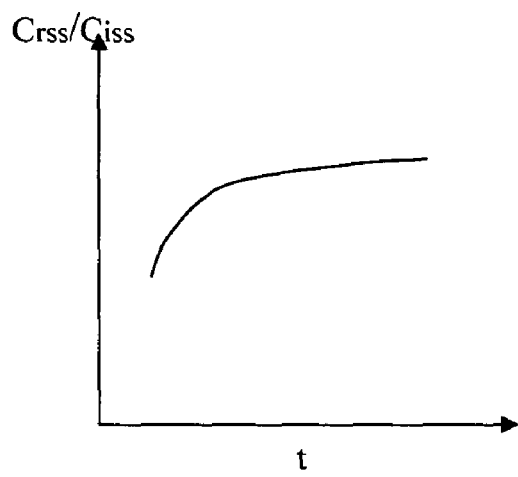
FIGS. 8A and 8B are the dependence of Crss/Ciss ratio over oxide thickness and gate protrusion respectively.
Figure 8B:
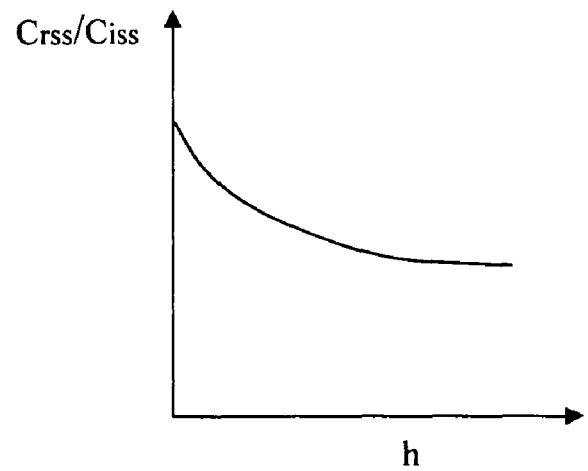

Additional capacitor is formed between the second polysilicon layer 135 and the gate 125. The input capacitance Ciss is increased with this additional capacitor thus improves the Crss/Ciss ratio. The capacitance of the added capacitor between the first and second poly can be adjusted by changing the thickness of the inter-polysilicon dielectric layer 140. FIG. 8A shows the dependence of Crss/Ciss ratio over the thickness of inter-poly layer t. The capacitance may also be adjusted by changing the protrusion of the polysilicon gate outside of the trench. FIG. 8B shows a functional relationship of Crss/Ciss ratio that changes versus the gate protrusion h. Therefore, the Crss/Ciss ratio can be flexibly adjusted independent from the other device performance parameters.

Figure 1:
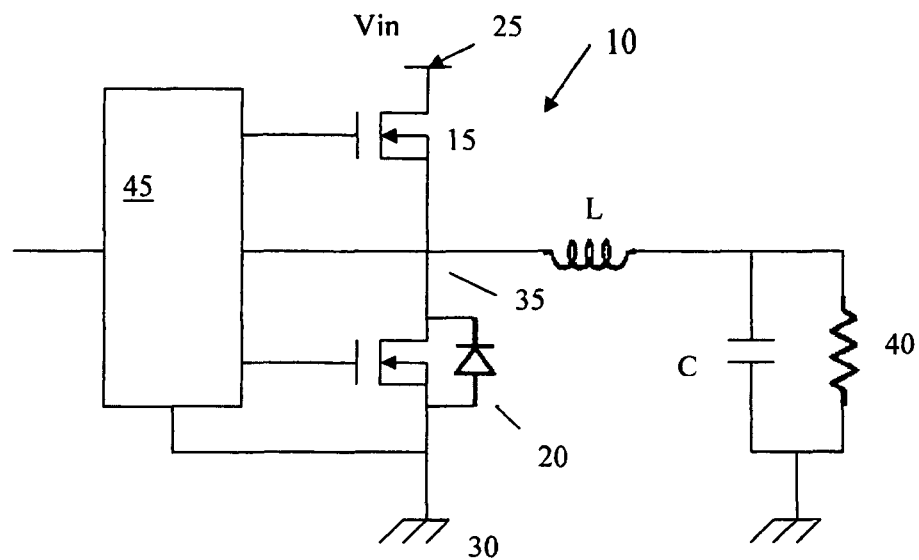
FIG. 1 is a circuit diagram of a conventional buck converter.
Figure 2:
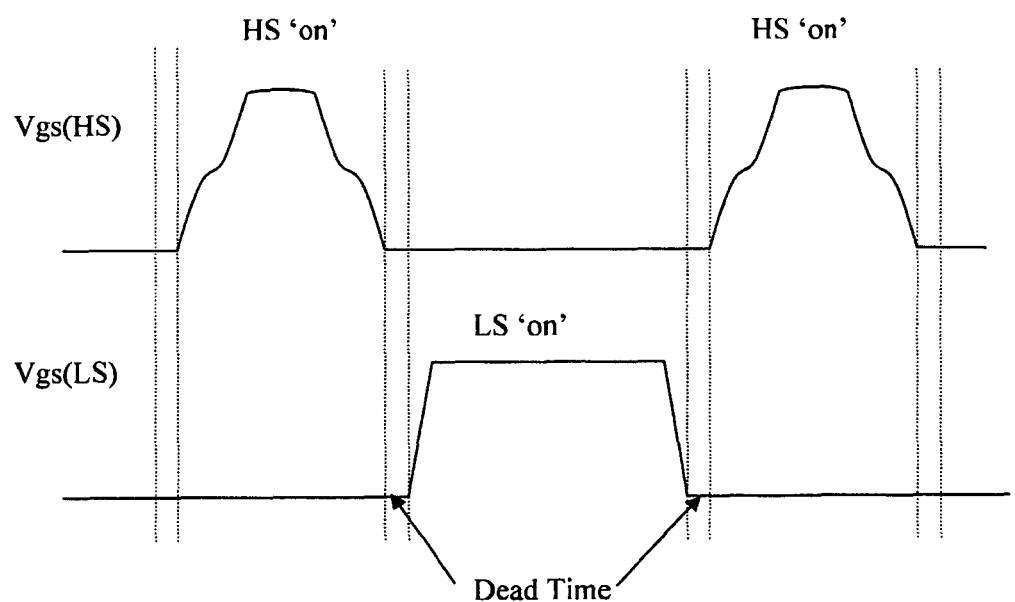
FIG. 2 shows the waveforms of gate voltages for the high side and low side MOSFET of FIG. 1.
Figure 3:
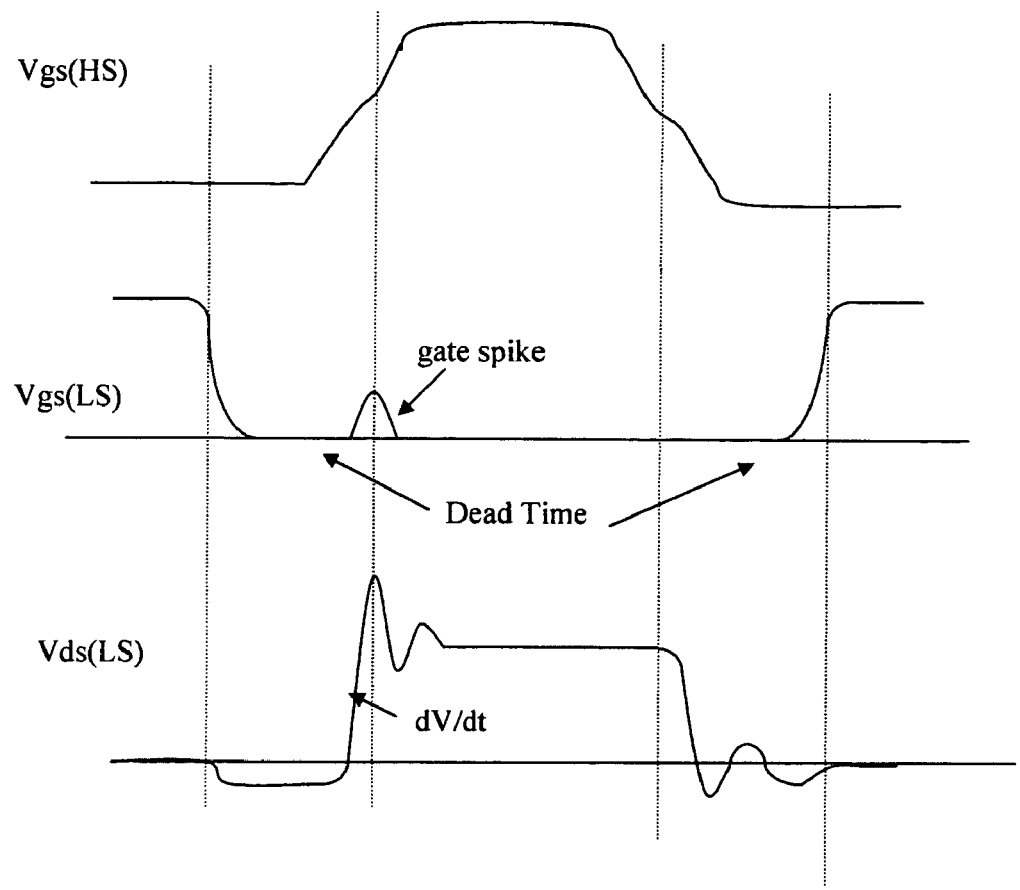
FIG. 3 shows the gate spike and drain to source voltage Vds of the low side MOSFET resulting from a high rate of change of the drain (Vds) voltage of high side MOSFET.
Figure 4:
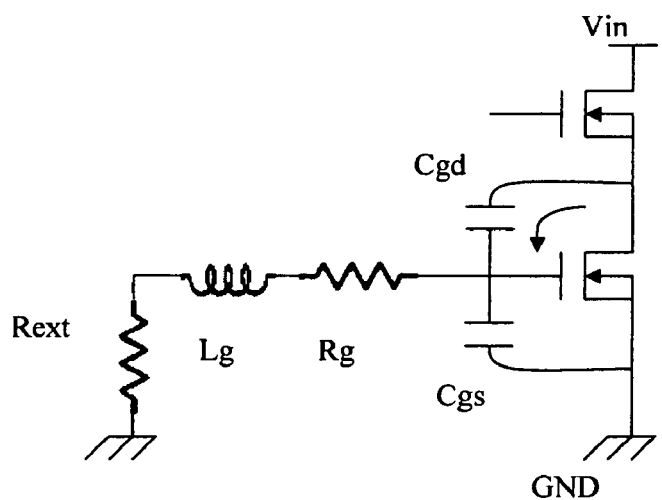
FIG. 4 shows a conventional circuit in attempt to resolve the shoot through problem as that shown in FIG. 3.
Figure 5A:
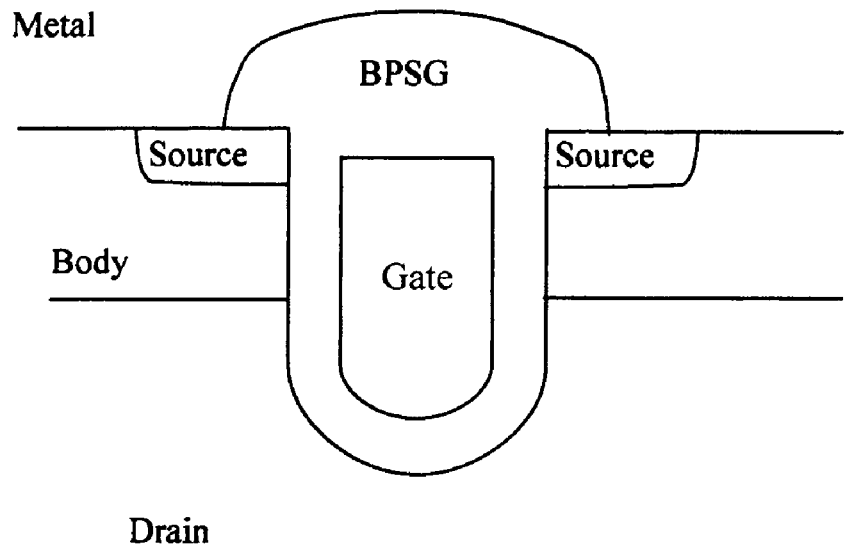
FIG. 5A shows a typical conventional trench MOSFET.
Figure 5B:
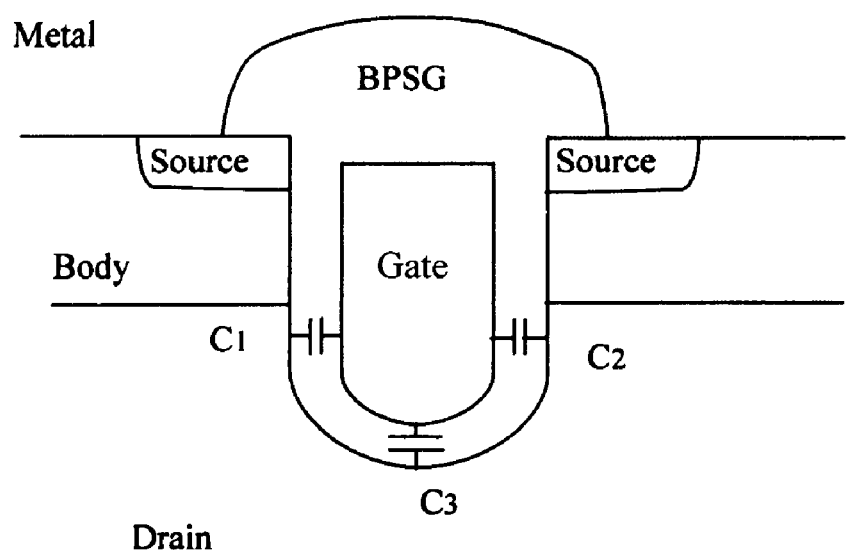
FIG. 5B is a diagram showing the components of Ciss and Crss.
Figure 6:
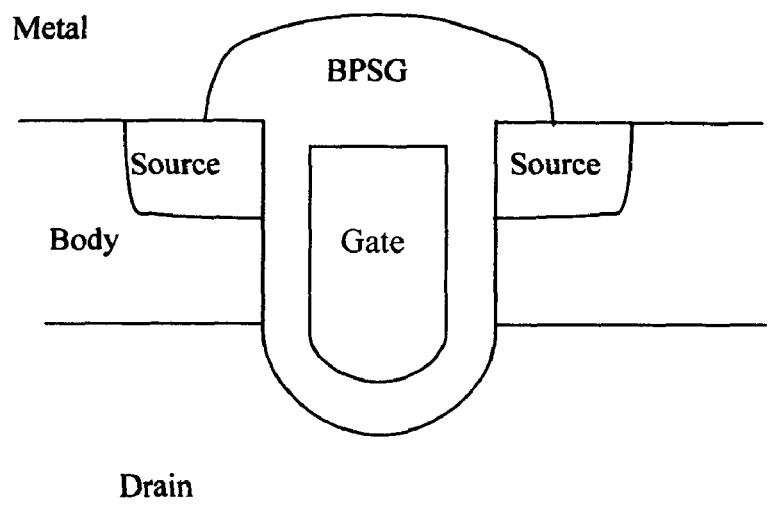
FIG. 6 shows a MOSFET with increased source depth to increase Ciss.

As explained above, the input capacitance Ciss and feedback capacitance Crss of the MOSFET device are determinate by the functional relationship that Ciss=Cgd+Cgs and Crss=Cgd. Therefore, the ratio Crss/Ciss reduces as Cgs is increased because that causes increased value of Ciss. According to what is shown in FIG. 4, a large Cgs has the benefit of drawing most of the transient drain current Cdg*dV/dt to the ground through the capacitor, leaving less current to go through the external gate controller thus lowering the gate spike voltage and avoiding the occurrences of a shoot through.

According to above descriptions, this invention discloses a trenched vertical semiconductor power device that includes a capacitor formed between a conductive layer covering over an inter-dielectric layer disposed on top of a trenched gate. In a preferred embodiment, the trenched vertical semiconductor power device further includes a trenched metal oxide semiconductor field effect transistor (MOSFET) power device. In a preferred embodiment, the trenched gate further comprises a trenched polysilicon gate. In a preferred embodiment, the conductive layer further comprises a second polysilicon layer covering an inter-poly dielectric layer disposed on top of a trenched polysilicon gate. In a preferred embodiment, the conductive layer is further connected to a source of the vertical power device. In a preferred embodiment, the trenched vertical semiconductor power device further includes a protective passivation layer covering the vertical semiconductor power device having metal contact openings to form metal contacts therein to electrically contact the trenched vertical semiconductor device. In a preferred embodiment, the inter-dielectric layer disposed above the trenched gate having a layer thickness substantially the same as the gate dielectric layer.

Figure 9A:
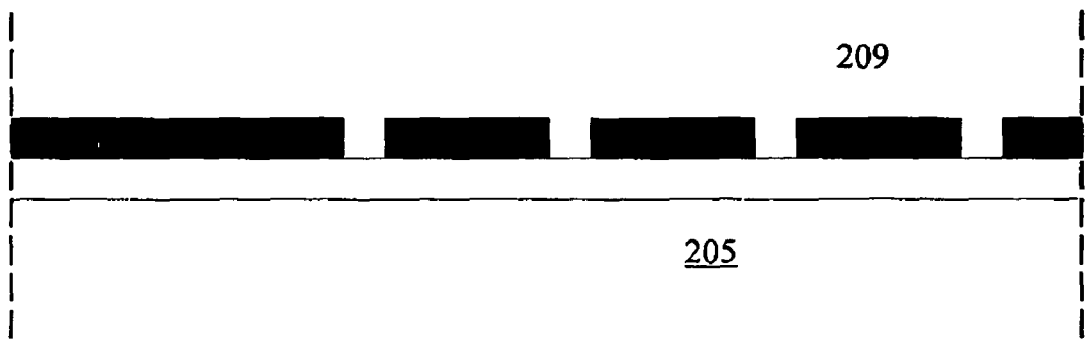
FIGS. 9A to 9T are a serial of side cross sectional views for illustrating the processing steps for manufacturing the MOSFET device of FIG. 7.
Figure 9B:
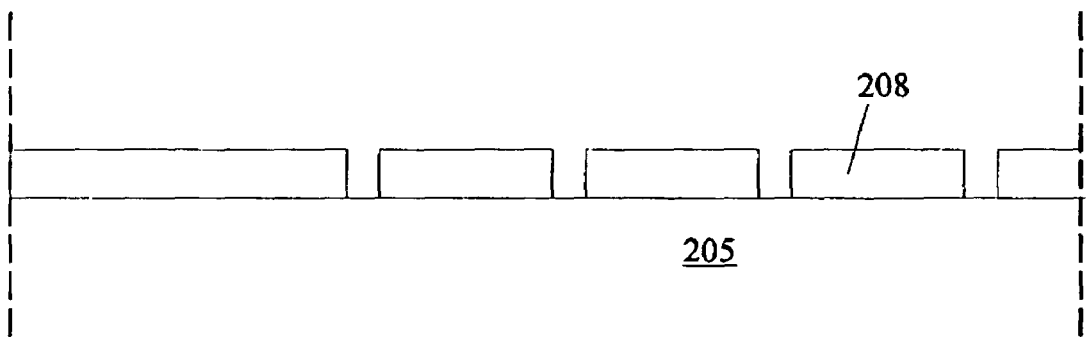
Figure 9C:
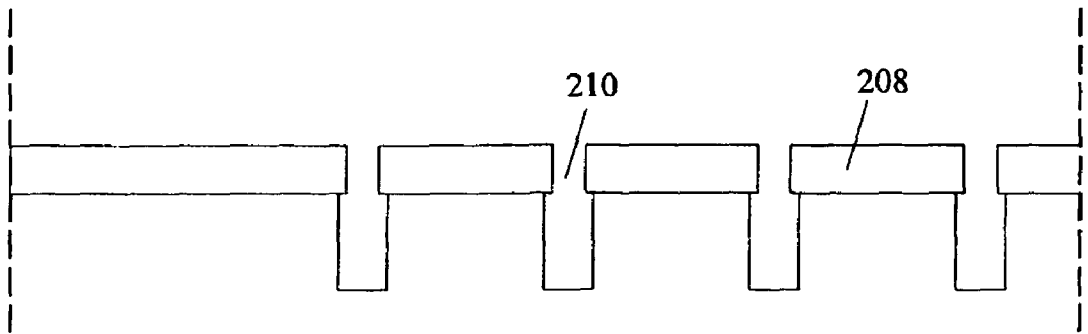
Figure 9D:
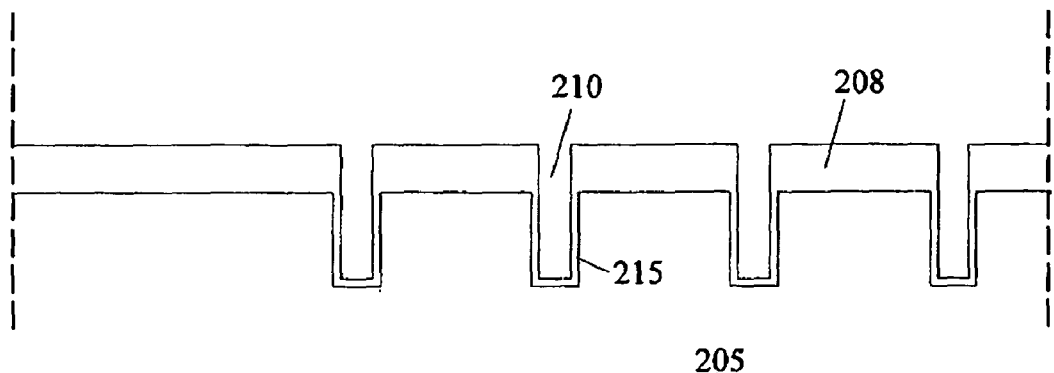
Figure 9E:
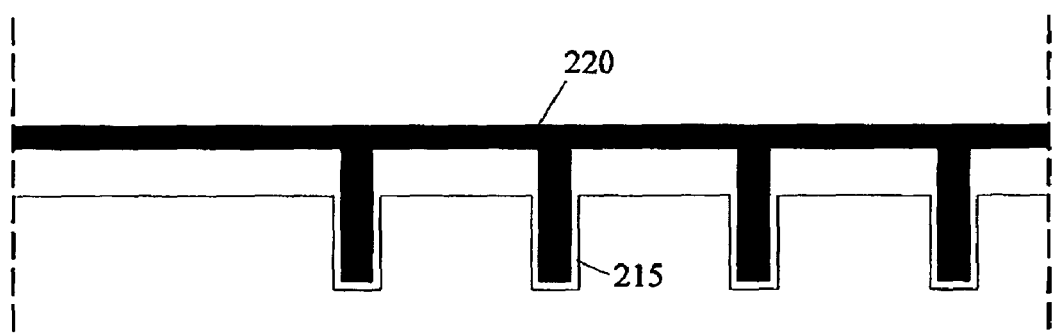
Figure 9F:
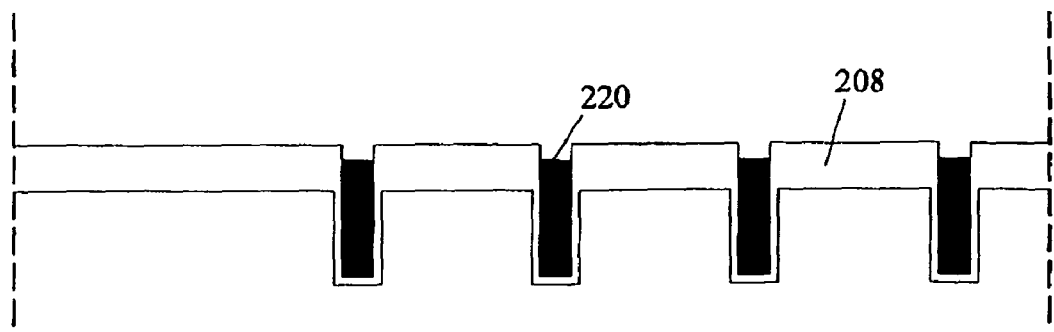
Figure 9G:
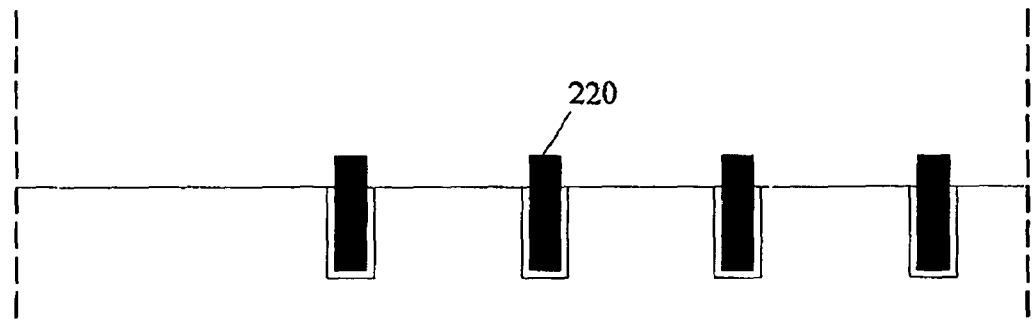
Figure 9H:
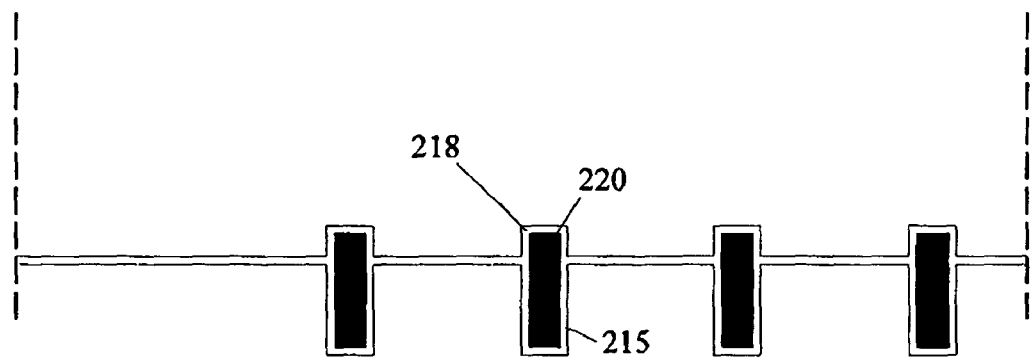
Figure 9I:
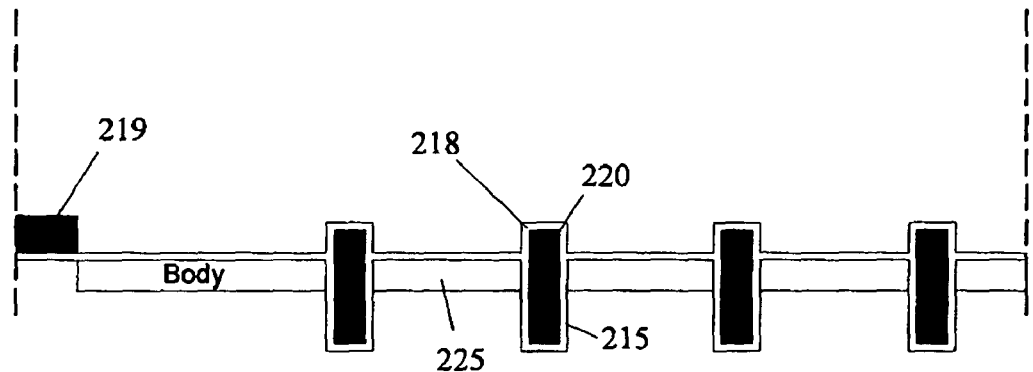
Figure 9J:
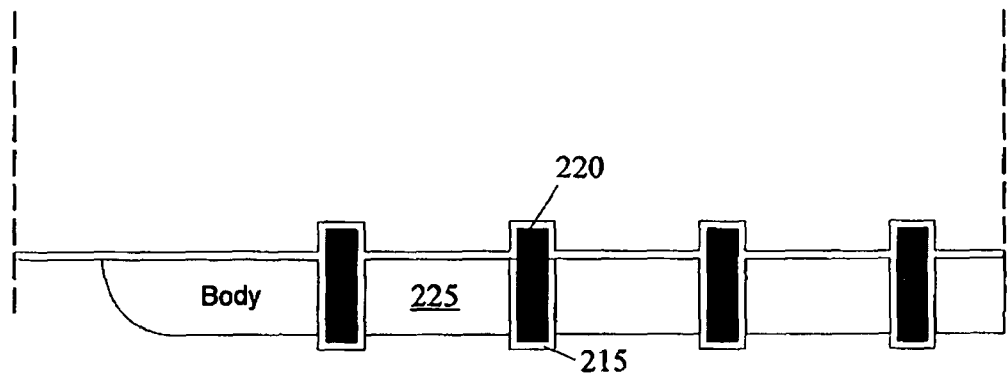
Figure 9K:
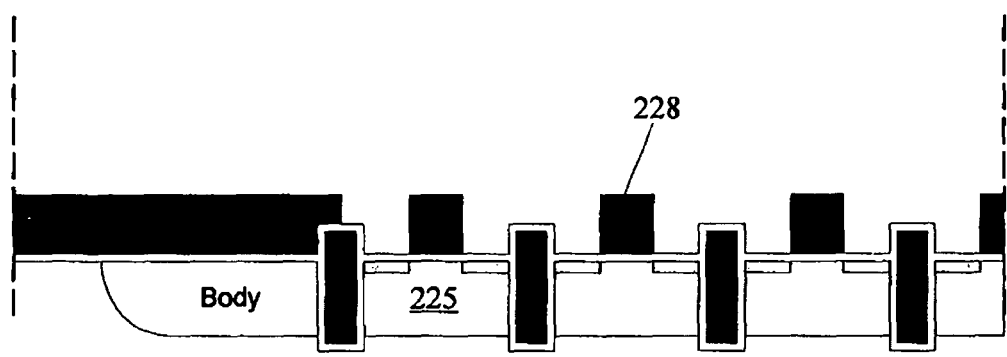
Figure 9L:
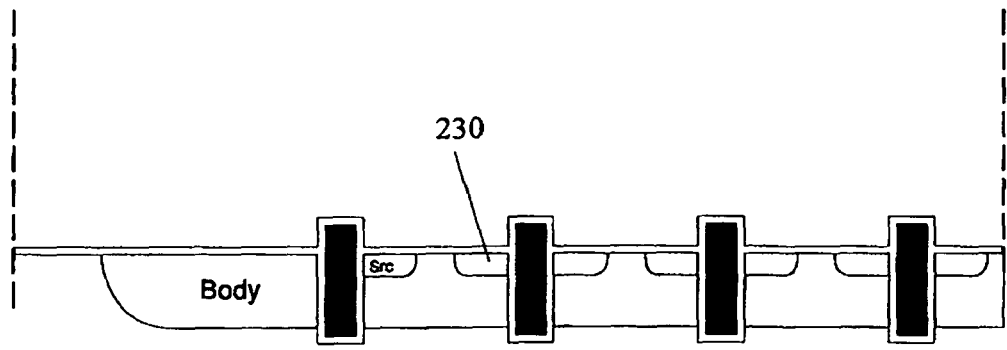
Figure 9M:
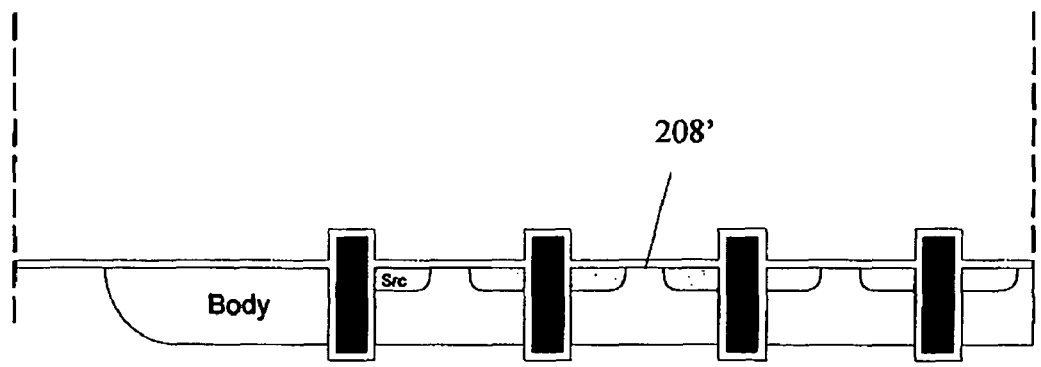
Figure 9N:
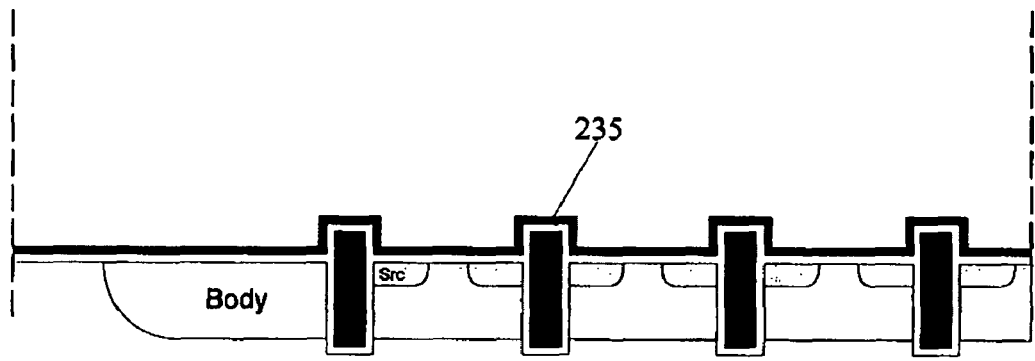
Figure 9O:
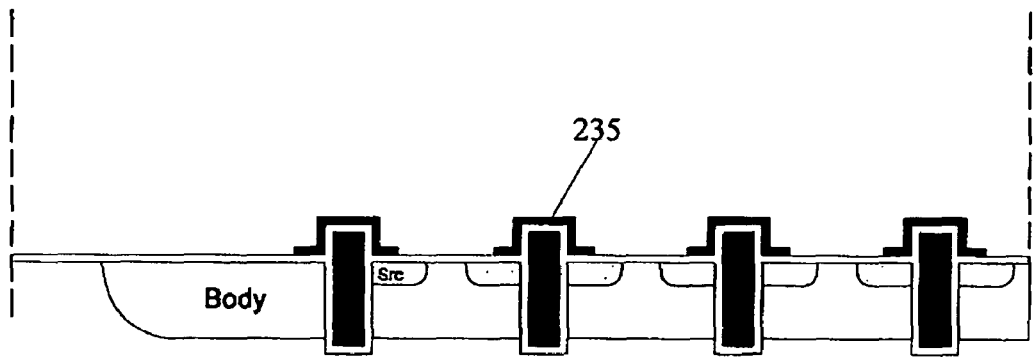
Figure 9P:
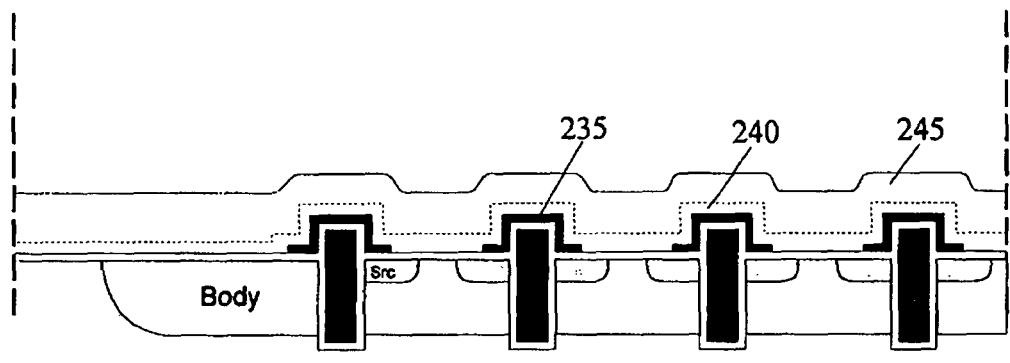
Figure 9Q:
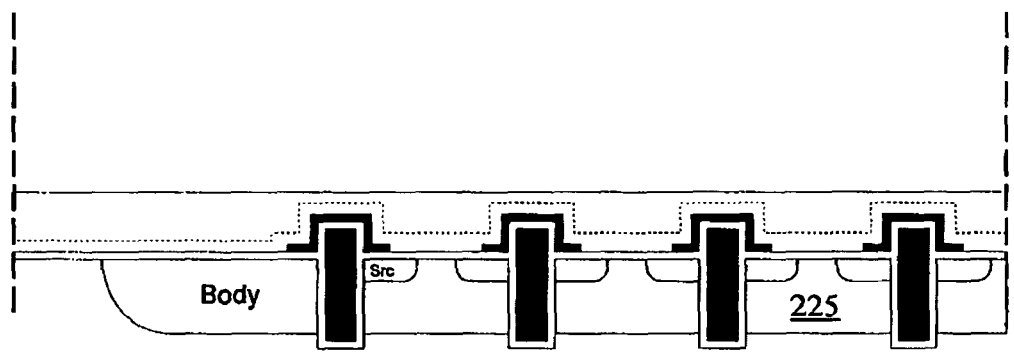
Figure 9R:
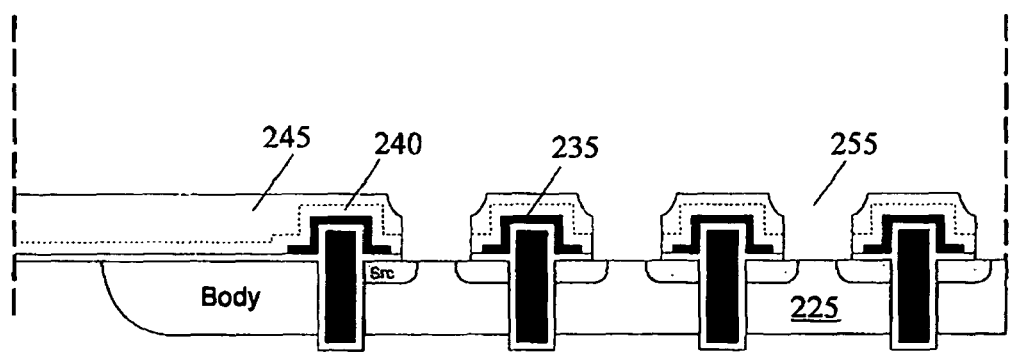
Figure 9S:
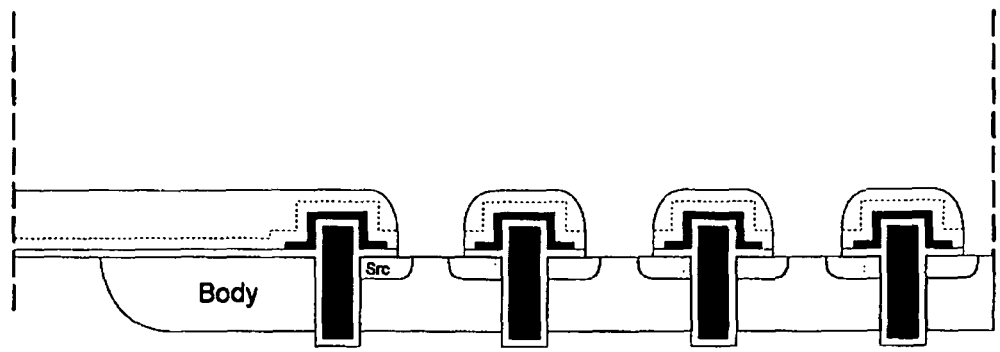
Figure 9T:
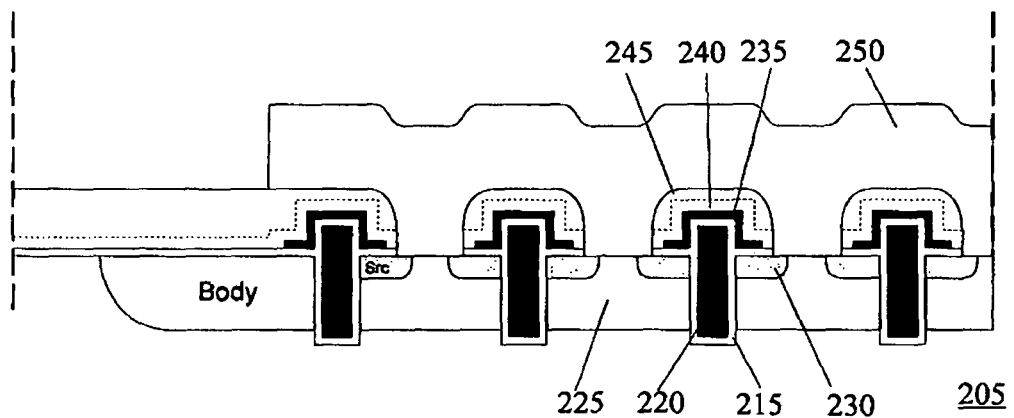

Referring to FIGS. 9A to 9T a serial of side cross sectional views for illustrating the processing steps to manufacture the MOSFET device as that shown in FIG. 7. In FIG. 9A, an initial oxidation is performed on a substrate 205 to form an initial oxide layer 208 followed by applying a trench mask 209. In FIG. 9B, the initial oxide layer 208 is etched and the photo resist layer 209 is stripped. In FIG. 9C, a trench etch is carried out to open a plurality of trenches into the substrate 205. In FIG. 9D, a gate oxidation process is performed to grow a gate oxide layer 215 and in FIG. 9E, a polysilicon layer 220 is deposited into the trenches followed by a blanket polysilicon etch back to form the trenched gate 220 as shown in FIG. 9F. In FIG. 9G, the initial oxide layer 208 is removed, followed by growing a screen oxide layer 218 as shown in FIG. 9H. In FIG. 9I, a body mask 219 is applied to carry out a body implant to form the body regions 225, then in FIG. 9J, the body mask 219 is removed and a body diffusion is carried out to diffuse the body regions 225 into the substrate 205. In FIG. 9K, a source mask 228 is applied followed by a source implant to form a plurality of source region 230, followed by removing the source mask 228 and a source diffusion to diffuse the source regions 230 into the substrate 205 as shown in FIG. 9L. In FIG. 9M, a bottom oxide layer 208' of an ONO (oxide-nitride-oxide) is first processed followed deposition of a polysilicon layer 235 in FIG. 9N, then the polysilicon layer mask is applied (not shown) to pattern the polysilicon layer 235 into gate-overlying polysilicon segments 235 as shown in FIG. 9O. In FIG. 9P, a LTO layer 240 and a BPSG layer 245 are deposited on top of the device followed by a BPSG densification process shown in FIG. 9Q. In FIG. 9R, a contact mask (not shown) is applied to open a plurality of contact opening 255 followed by carrying out a contact implant and LTO/BPSG reflow as shown in FIG. 9S. In FIG. 9T, a metal layer 250 is deposited on top followed by applying a metal mask to carry out a metal layer etch to pattern the metal contacts 250.

This invention further discloses a buck converter that includes a high-side MOSFET device having a first high-side source connected to a low-side drain of a low-side MOSFET device. The buck inverter further includes a capacitor formed between a conductive layer covering over an inter-dielectric layer disposed on top of a trenched gate of the low-side MOSFET device for increasing a gate-source capacitance Cgs for drawing a large current to the ground thus preventing a shoot through. In a preferred embodiment, the trenched gate of the low side MOSFET device further includes a trenched polysilicon gate. In a preferred embodiment, the conductive layer further includes a second polysilicon layer covering an inter-poly dielectric layer disposed on top of a trenched polysilicon gate of the low side MOSFET device. In a preferred embodiment, the conductive layer further connecting to a source of the low side MOSFET device. In a preferred embodiment, the inter-dielectric layer disposed above the trenched gate having a layer thickness ranging substantially the same as a gate dielectric thickness of the low side MOSFET device. In a preferred embodiment, the trenched gate of the low side MOSFET device further includes a gate protrusion protruding outside of the trenched gate. In a preferred embodiment, the low side MOSFET device further includes a trenched N-channel metal oxide semiconductor field effect transistor (MOSFET) power device. In a preferred embodiment, the low side MOSFET device further includes a trenched P-channel metal oxide semiconductor field effect transistor (MOSFET) power device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for fabricating a trenched vertical semiconductor power device comprising:
   forming a plurality of trenched gates by opening a plurality of trenches and filling the trenches with a first gate-conductive layer;
   depositing an inter-dielectric layer on top of said first gate-conductive layer;
   depositing a second gate-conductive layer on top of said inter-dielectric layer and patterning said second gate-conductive layer as a plurality of discrete segments each having a segment width approximately the same as a width of each of said trenched gates and having a cap shape with a top segment extending over substantially the width of each of said trenched gates above said inter-dielectric layer above said trenched gate and each of said conductive segments extends downwardly from both ends of the top segments and then outwardly to a horizontal location slightly beyond edges of each of said trenched gates on both ends; whereby forming said discrete segments to couple with said first gate-conductive layer over said inter-dielectric layer to constitute a capacitor.

2. The method of claim 1 wherein:
said step of filling said trenches with said first gate-conductive layer further comprising a step of filling said trenches with a polysilicon layer.

3. The method of claim 1 wherein:
said step of depositing said second gate-conductive layer on top of said inter-dielectric layer further comprising a step of depositing a second polysilicon layer on top of the inter-poly dielectric layer.

4. The method of claim 1 further comprising:
electrically connecting said second gate-conductive layer to a source region of said vertical semiconductor power device.

5. The method of claim 1 further comprising:
forming body regions around said trenched gates and source regions surrounding a top portion said trenched gates encompassed in said body regions followed by forming a protective passivation layer covering said vertical semiconductor power device and selectively etching metal contact openings in areas between said discrete segments to form metal contacts therein to electrically contact said body regions and source regions of said trenched vertical semiconductor device.

6. The method of claim 1 wherein:
said step of depositing said inter-dielectric layer on top of said first gate-conductive layer further comprising a step of forming said inter-dielectric layer with a layer thickness substantially the same as a thickness of a gate dielectric layer padded on sidewalls and bottom surface of said trenches.

7. The method of claim 1 wherein:
said step of filling said trenches with said first gate-conductive layer comprises a step of filling said trenches with said first gate-conductive layer protruding above a top surface of said trenches.

8. The method of claim 1 further comprising:
Implanting P-type body regions around said trenched gates and implanting N-type source regions surrounding a top portion said trenched gates encompassed in said body regions thus forming said vertical semiconductor device as a trenched N-channel metal oxide semiconductor field effect transistor (MOSFET) power device.

9. The method of claim 1 further comprising:
Implanting N-type body regions around said trenched gates and implanting P-type source regions surrounding a top portion said trenched gates encompassed in said body regions thus forming said vertical semiconductor device as a trenched P-channel metal oxide semiconductor field effect transistor (MOSFET) power device.

10. A method for adjusting a gate-source capacitance (Cgs) of a trenched MOSFET device comprising:
forming a plurality of trenched gates by opening a plurality of trenches and filling the trenches with a first gate-conductive layer;
depositing an inter-dielectric layer on top of said first gate-conductive layer;
depositing a second gate-conductive layer on top of said inter-dielectric layer and patterning said second gate-conductive layer as a plurality of discrete segments each having a segment width approximately the same as a width of each of said trenched gates and having a cap shape with a top segment extending over substantially the width of each of said trenched gates above said inter-dielectric layer above said trenched gate and each of said conductive segments extends downwardly from both ends of the top segments and then outwardly to a horizontal location slightly beyond edges of each of said trenched gates on both ends; whereby forming said discrete segments to couple with said first gate-conductive layer over said inter-dielectric layer to constitute a capacitor for adjusting a gate-source capacitance (Cgs) of a trenched MOSFET device.

11. The method of claim 10 further comprising:
said step of filling said trenches with said first gate-conductive layer further comprising a step of filling said trenches with a polysilicon layer.

12. The method of claim 11 wherein:
said step of depositing said second gate-conductive layer on top of said inter-dielectric layer further comprising a step of depositing a second polysilicon layer on top of the inter-poly dielectric layer.

13. The method of claim 10 wherein:
said step of filling said trenches with said first gate-conductive layer comprises a step of filling said trenches with said first gate-conductive layer protruding above a top surface of said trenches.

* * * * *